(12) United States Patent
Frey et al.

(10) Patent No.: US 9,812,615 B2
(45) Date of Patent: Nov. 7, 2017

(54) METHOD OF OPTIMIZING THE QUANTUM EFFICIENCY OF A PHOTODIODE

(71) Applicants: STMicroelectronics SA, Montrouge (FR); Commissariat a l'Energie Atomique et aux Energies Alternatives, Paris (FR)

(72) Inventors: Laurent Frey, Grenoble (FR); Michel Marty, Saint Paul de Varces (FR)

(73) Assignees: STMicroelectronics SA, Montrouge (FR); Commissariat A L'Energie Atomique et aux Energies Alternatives, Paris (FR)

( * ) Notice: Subject to any disclaimer, the term of this patent is extended or adjusted under 35 U.S.C. 154(b) by 103 days.

(21) Appl. No.: 14/659,751

(22) Filed: Mar. 17, 2015

(65) Prior Publication Data
US 2015/0270447 A1    Sep. 24, 2015

(30) Foreign Application Priority Data
Mar. 20, 2014 (FR) ...................... 14 52334

(51) Int. Cl.
| | |
|---|---|
| H01L 31/0232 | (2014.01) |
| H01L 27/146 | (2006.01) |
| H01L 33/00 | (2010.01) |
| H01L 21/66 | (2006.01) |
| H01L 33/44 | (2010.01) |
| H01L 31/0216 | (2014.01) |

(Continued)

(52) U.S. Cl.
CPC ............... *H01L 33/44* (2013.01); *G02B 1/11* (2013.01); *H01L 22/26* (2013.01);
(Continued)

(58) Field of Classification Search
CPC .......... H01L 27/14685; H01L 27/1462; H01L 27/14636; H01L 27/14649;
(Continued)

(56) References Cited

U.S. PATENT DOCUMENTS

| | | | | |
|---|---|---|---|---|
| 6,221,687 B1 * | 4/2001 | Abramovich | ..... | H01L 27/14601 438/69 |
| 2001/0010943 A1 * | 8/2001 | Tsang | .................. | H01L 27/1443 438/69 |

(Continued)

FOREIGN PATENT DOCUMENTS

WO    WO-2013146816 A1    10/2013

OTHER PUBLICATIONS

INPI Search Report and Written Opinion for FR 1452334 dated Dec. 18, 2014 (8 pages).

*Primary Examiner* — Marvin Payen
*Assistant Examiner* — Jeremy Joy
(74) *Attorney, Agent, or Firm* — Gardere Wynne Sewell LLP

(57) ABSTRACT

A photodiode has an active portion formed in a silicon substrate and covered with a stack of insulating layers successively including at least one first silicon oxide layer, an antireflection layer, and a second silicon oxide layer. The quantum efficiency of the photodiode is optimized by: determining, for the infrared wavelength, first thicknesses of the second layer corresponding to maximum absorptions of the photodiode, and selecting, from among the first thicknesses, a desired thickness, $eox_D$, so that a maximum manufacturing dispersion is smaller than a half of a pseudo-period separating two successive maximum absorption values.

17 Claims, 3 Drawing Sheets

(51) Int. Cl.
*G02B 1/11* (2015.01)
*H01L 33/34* (2010.01)
*H01L 33/62* (2010.01)

(52) U.S. Cl.
CPC .... *H01L 27/1462* (2013.01); *H01L 27/14649* (2013.01); *H01L 27/14669* (2013.01); *H01L 31/02161* (2013.01); *H01L 31/02165* (2013.01); *H01L 33/0054* (2013.01); *H01L 33/34* (2013.01); *H01L 33/62* (2013.01); *H01L 2933/0025* (2013.01); *H01L 2933/0066* (2013.01)

(58) Field of Classification Search
CPC ......... H01L 27/14625; H01L 31/02165; H01L 31/02161; H01L 2933/0025; H01L 27/14669
See application file for complete search history.

(56) References Cited

U.S. PATENT DOCUMENTS

| | | | |
|---|---|---|---|
| 2004/0012021 A1* | 1/2004 | Hosokawa | H01L 31/02162 257/53 |
| 2005/0186754 A1* | 8/2005 | Kim | H01L 27/14601 438/401 |
| 2006/0033008 A1* | 2/2006 | Vaillant | H01L 27/14627 250/208.1 |
| 2006/0214251 A1* | 9/2006 | Ratnam | H01L 31/02165 257/437 |
| 2007/0045683 A1* | 3/2007 | Willemin | H01L 31/02161 257/292 |
| 2007/0072326 A1* | 3/2007 | Zheng | H01L 27/1462 438/48 |
| 2009/0256225 A1* | 10/2009 | Nakai | H01L 27/14623 257/432 |
| 2009/0294889 A1* | 12/2009 | Hara | H01L 27/1462 257/435 |
| 2010/0163709 A1* | 7/2010 | Leonardi | H01L 27/1443 250/205 |
| 2010/0314667 A1* | 12/2010 | Nozaki | H01L 27/14609 257/225 |
| 2012/0038814 A1 | 2/2012 | Tayanaka | |
| 2012/0112254 A1 | 5/2012 | Nagano | |
| 2015/0048239 A1* | 2/2015 | Tominaga | G02B 1/116 250/208.1 |

* cited by examiner

METHOD OF OPTIMIZING THE QUANTUM EFFICIENCY OF A PHOTODIODE

PRIORITY CLAIM

This application claims the priority benefit of French Application for Patent No. 1452334, filed on Mar. 20, 2014, the contents of which is hereby incorporated by reference in its entirety to the maximum extent allowable by law.

TECHNICAL FIELD

The present disclosure relates to semiconductor photodiodes, and more particularly to a method of optimizing the quantum efficiency of said photodiodes.

BACKGROUND

FIG. 1 schematically shows a portion submitted to an illumination, or active portion, of a semiconductor photodiode for example used as a SPAD ("Single Photon Avalanche Diode") device. The photodiode is formed in a silicon semiconductor substrate 1 comprising an area 3 where photons are converted into electron-hole pairs. Area 3 of a first conductivity type is topped with an area 4 of the opposite conductivity type. In a complete photodiode, substrate 1 comprises other junctions (not shown) between semiconductor regions of opposite type to store electrons, and various transistors for transferring electrons to a read circuit.

In a "front side" configuration, that is, where the light is received by the front surface of the substrate, the active portion of the photodiode is coated with a stack of several insulating layers transparent to the operating wavelength, for example, a wavelength in the range from 700 to 1,000 nm corresponding to infrared light. The shown stack successively comprises a silicon oxide layer 9, an antireflection layer 11, a thick silicon oxide layer 13, and a thick silicon nitride layer 15. Thick layer 15 is the upper layer of the stack. Layer 15 is generally coated with a filtering layer and with a microlens (not shown in FIG. 1).

Currently, in a photodiode of the shown type, the layer thicknesses are the following: from 1,000 to 3,000 nm for semiconductor substrate 1, from 500 to 2,000 nm for conversion area 3, from 500 to 1,500 nm for area 4, from 5 to 50 nm for silicon oxide layer 9, from 10 to 100 nm for silicon nitride antireflection layer 11, from 700 to 2,500 nm for silicon oxide layer 13 (which may be a stack of several silicon oxide layers), and from 400 to 700 nm for silicon nitride layer 15.

In the case of an infrared diode, a silicon thickness in the order of 50 μm is necessary to absorb 95% of the received light, which is much thicker than conventional thicknesses of layers used in microelectronics. Further, the infrared photodiode is often part of an assembly of visible light (red, blue, green) detection diodes and area 3 where photons are converted into electron-hole pairs is relatively thin and thus poorly adapted to the detection of infrared light. Thus, in the case where light rays in the infrared range cross the stack and then penetrate into semiconductor substrate 1, the photons are only very partially absorbed across the thickness in the range from 500 to 2,000 nm of the conversion area. For a thickness of conversion area 3 equal to 1,500 nm, the quantum efficiency is in the range from 5 to 6% only.

It would be desirable to increase this quantum efficiency.

SUMMARY

Thus, an embodiment provides a method of optimizing the quantum efficiency of a photodiode having its active portion formed in a silicon substrate and covered with a stack of insulating layers transparent to an infrared wavelength, said stack successively comprising at least one first silicon oxide layer having a thickness in the range from 5 to 50 nm, an antireflection layer having a thickness in the range from 10 to 80 nm, and a second silicon oxide layer. The optimization method comprises the steps of: determining for said infrared wavelength first thicknesses of the second layer corresponding to maximum absorptions of the photodiode, a pseudo-period separating two successive maximum values, and selecting, from among the first thicknesses, a desired thickness, $eox_D$, so that the maximum manufacturing dispersion, $D*eox_D$, is smaller than half the pseudo-period, D being a manufacturing dispersion rate.

According to an embodiment, the second silicon oxide layer is coated with a silicon nitride layer having a thickness lower than 50 nm.

According to an embodiment, the infrared wavelength is in the range from 700 to 1,000 nm.

According to an embodiment, the thickness of the substrate is in the range from 1 to 3 μm.

According to an embodiment, the antireflection layer is made of silicon nitride.

According to an embodiment, the infrared wavelength is equal to 850 nm, the dispersion rate is equal to 0.1, the thickness of the first silicon oxide layer is 25 nm, the thickness of the antireflection layer is 50 nm, and the desired thickness $eox_D$ selected for the second silicon oxide layer is 60 nm, 340 nm, or 640 nm.

An embodiment provides a method of manufacturing a photodiode having an optimized quantum efficiency, comprising the steps of: a) providing a photodiode having its active portion formed in a silicon substrate and covered with a stack of insulating layers transparent to an infrared wavelength, the stack successively comprising at least a first silicon oxide layer, an antireflection layer, a second silicon oxide layer having a thickness greater than or equal to a desired thickness eoxD, an etch stop layer, and a third silicon oxide layer; and b) etching said stack all the way to the etch stop layer.

According to an embodiment, the method further comprises the step of etching the etch stop layer.

According to an embodiment, the thickness of the second layer is greater than desired thickness $eox_D$, the method further comprising the step of partially etching the second layer to leave in place a portion of desired thickness $eox_D$.

According to an embodiment, the etch stop layer is made of silicon nitride.

An embodiment provides a photodiode having its active portion formed in a silicon substrate and covered with a stack of insulating layers transparent to an infrared wavelength, said stack successively comprising at least: a first silicon oxide layer having a thickness in the range from 5 to 50 nm, and a second silicon oxide layer, said second layer having a thickness corresponding, for said infrared wavelength, to one of the maximum absorption values of the photodiode, a pseudo-period separating two successive maximum values, said thickness being such that the maximum manufacturing dispersion, $D*eox_D$, is smaller than half the pseudo-period, D being a manufacturing dispersion rate.

According to an embodiment, the photodiode comprises, between the first and second silicon oxide layers, an antireflection layer having a thickness in the range from 10 to 80 nm.

According to an embodiment, the photodiode comprises, outside of said active area, an interconnect network comprising a stack of portions of silicon oxide layers, of diffusion barrier layers, and of at least one metal.

According to an embodiment, the top of said second layer is at the level of the lower surface of one of the diffusion barrier layer portions.

According to an embodiment, the diffusion barrier layer portion at which said second layer stops is maintained above said second layer.

According to an embodiment, the top of said second layer is under the level of the lower surface of one of the diffusion barrier layer portions.

According to an embodiment, the top of said second layer is above the level of the lower surface of one of the diffusion barrier layer portions.

According to an embodiment, said one of the diffusion barrier layer portions is a portion of the lowest diffusion barrier layer of the interconnect network.

According to an embodiment, the diffusion barrier layers are made of silicon nitride.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

Figure 1:
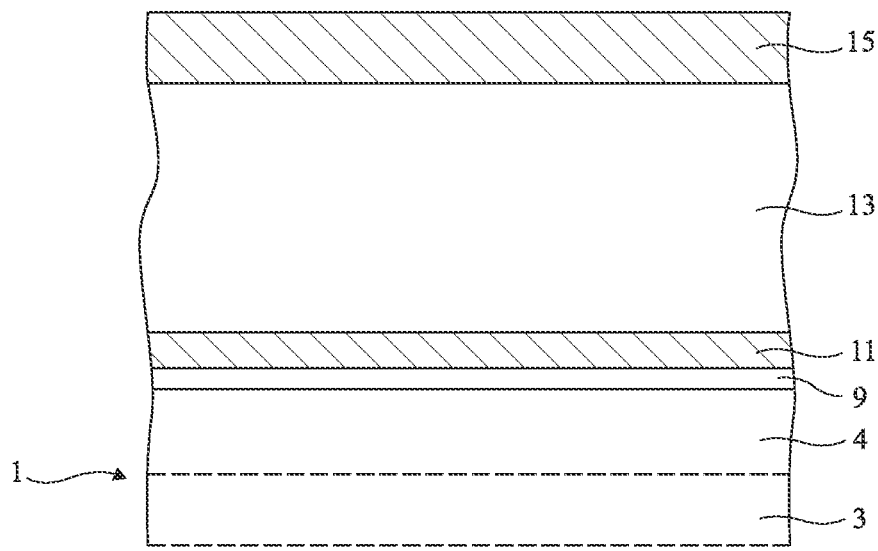
FIG. 1, previously described, schematically shows an example of an active portion of a photodiode.

For clarity, the same elements have been designated with the same reference numerals in the various drawings and the various drawings are not to scale.

As will be seen in detail hereafter, the inventors have studied the variation of the quantum efficiency of a photodiode according to various parameters. They have noted that such a quantum efficiency does not only depend on the thickness of the conversion area of this photodiode, but also on the nature of the insulating layers of the stack located above the active portion, as well as on the thicknesses of these layers.

Figure 2:
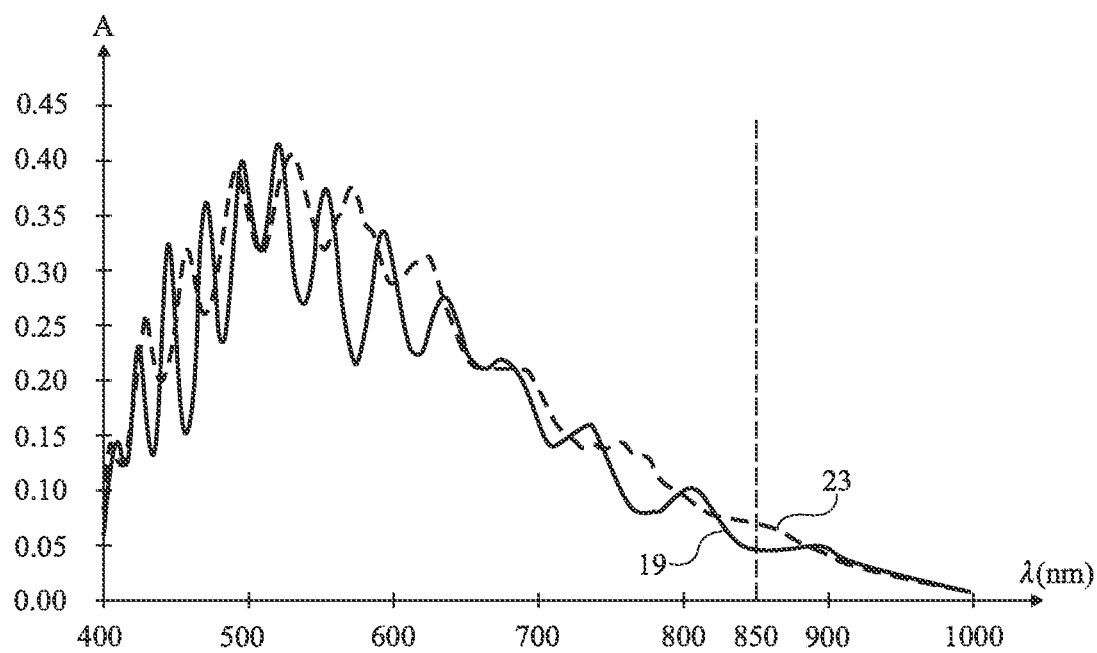
FIG. 2 shows the absorption rate according to the wavelength for two photodiodes of the type in FIG. 1.

FIG. 2 shows absorption rate A of two different photodiodes according to wavelength λ, of the incident light. In these two photodiodes of the type in FIG. 1, thick silicon oxide layer 13 has a 2,150-nm thickness.

Curve 19 corresponds to a photodiode where all the layers of the stack shown in FIG. 1 have been kept. Curve 23 corresponds to a photodiode where thick silicon nitride layer 15 has been removed.

For wavelengths in the range from 740 to 790 nm or from 820 to 880 nm, the photodiode of curve 23 has an absorption rate higher than that of the photodiode of curve 19. In other words, photodiodes of the type in FIG. 1 where thick silicon nitride layer 15 has been removed have a higher absorption rate in certain wavelength ranges than photodiodes where thick silicon nitride layer 15 has been left in place.

Curves 19 and 23 have been obtained for photodiodes where the layers have thicknesses equal to: 1,500 nm for conversion area 3, 1,000 nm for area 4, 25 nm for layer 9, 50 nm for layer 11, 2,150 nm for thick silicon oxide layer 13, and 500 nm for thick silicon nitride layer 15 when present.

For an operating wavelength equal to 850 nm, the absorption rate of the photodiode corresponding to layer 19 is equal to 4.5% while the absorption rate of the photodiode corresponding to curve 23 is higher and equal to 6.5%. Thus, the suppression of thick silicon nitride layer 15 in a photodiode of the type in FIG. 1 enables an absorption gain.

Figure 3:
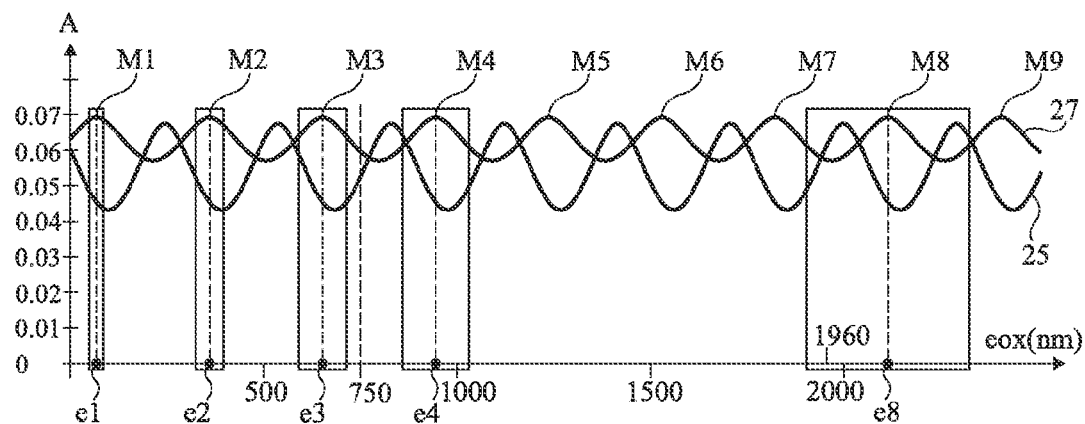
FIG. 3 shows, according to the thickness of a coating layer and for a given wavelength, the absorption rate for two photodiodes of the type in FIG. 1.

FIG. 3 shows, for a wavelength equal to 850 nm, absorption rate A of two photodiodes of the type in FIG. 1 according to thickness eox of silicon oxide 13. Curve 25 corresponds to a photodiode where thick silicon nitride layer 15 (from 400 to 700 nm) has been left in place. Curve 27 corresponds to a photodiode where thick silicon nitride layer 15 has been removed.

Curves 25 and 27 have substantially periodic maximum and minimum absorptions, with a pseudo-period T, which shows that interference phenomena occur. Indeed, oxide layer 13 is located between two silicon nitride layers 11 and 15 having an optical index different from that of layer 13. There thus is a Fabry-Perot optical cavity with multiple reflections between the two silicon nitride layers, whereby oscillations appear in layers 25 and 27. Such oscillations correspond to the interferences in the optical cavity, which are constructive or destructive according to the wavelength and according to the thickness. When layer 15 is removed, the reflection is strongly decreased and the oscillations are of lower amplitude, which can be seen on curve 27. They are however still present since a low reflection remains at the interface between silicon oxide layer 13 and air. Maximum values M1 to M9 of curve 27 are substantially identical to the maximum values of curve 25, and even slightly higher for layer 27 than for layer 25. The average absorption is equal to 5.5% and 6.28%, respectively, for curves 25 and 27.

This first analysis of curves 25 and 27 shows that it is preferable to be in conditions corresponding to curve 27 (absence of a thick silicon nitride layer 15) since, then, the absorption of the conversion area will be in average higher than in conditions corresponding to curve 25 (presence of a thick silicon nitride layer 15).

There also appears to be preferable to select a thickness of silicon oxide layer 13 corresponding to a maximum absorption, and preferably to a maximum absorption of curve 27. However, due to manufacturing dispersions, it is generally not possible to very exactly obtain a silicon oxide layer having a desired thickness $eox_D$. Indeed, when layers of a desired thickness $eox_D$ are desired to be manufactured, layers having effective obtained thicknesses $eox_O$ in the range from $eox_D - D*eox_D$ to $eox_D + D*eox_D$ are obtained, D being a manufacturing dispersion rate capable of currently reaching a value in the order of 0.1.

Thus, if it is desired for effective thickness $eox_O$ to correspond to an absorption value close to a maximum absorption, in addition to selecting $eox_D$ corresponding to a maximum absorption, the spectrum of the effective thicknesses $eox_O$ resulting from manufacturing dispersions should be much lower than pseudo-period T of the absorption curves.

As an example, if dispersion rate D is equal to 0.1 and pseudo-period T is equal to 300 nm, desired thickness $eox_D$ should correspond to a maximum absorption and $2*D*eox_D$ should be much smaller than 300 nm, for example, smaller than half of 300 nm.

Referring to FIG. 3 and considering a maximum manufacturing dispersion D=0.1, so that 2*D*eox$_D$ is for example smaller than 150 nm, eox$_D$ should be smaller than 750 nm. Thus, considering first maximum values M1, M2, M3 of curve 27, the corresponding thicknesses of silicon oxide layer 13 are respectively e1=60 nm, e2=340 nm, and e3=640 nm and are smaller than 750 nm. With a view to the manufacturing of a layer 13 having a desired thickness eox$_D$ equal to e1, e2, or e3, effective thickness eox$_O$ will be respectively in the range from 54 to 66 nm, from 306 to 374 nm, or from 576 to 704 nm. The absorption rates corresponding to effective thicknesses eox$_O$ will then be close to the maximum absorption.

Conversely, considering maximum values M4 and M8, the corresponding thicknesses of layer 13 are respectively e4=940 nm and e8=2,100 nm. With a view to the manufacturing of a layer 13 having a desired thickness eox$_D$ equal to e4 or e8, effective thickness eox$_O$ will be respectively in the range from 845 to 1,035 nm or from 1,890 to 2,310 nm. The absorption rates corresponding to the obtained effective thicknesses eox$_O$ may be distant from the maximum absorption, and in the worst case may correspond to a minimum absorption, for example, when eox$_O$=1,960 nm.

Thus, in the case where desired thickness eox$_D$ corresponds to a relatively thin silicon oxide layer 13, that is, where 2*D*eox$_D$ is smaller than pseudo-period T, the selection of a thickness eox$_D$ corresponding to a maximum absorption, preferably of layer 27, enables to improve the absorption rate of a photodiode of the type in FIG. 1 despite manufacturing dispersions.

Figure 4A:
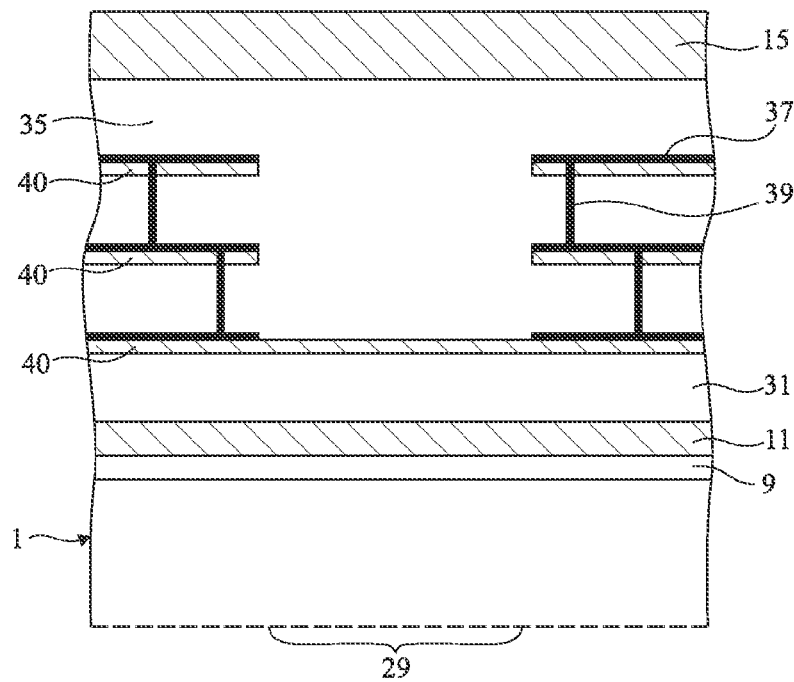
FIGS. 4A and 4B illustrate successive steps of the manufacturing of a photodiode having an improved quantum efficiency.
Figure 4B:
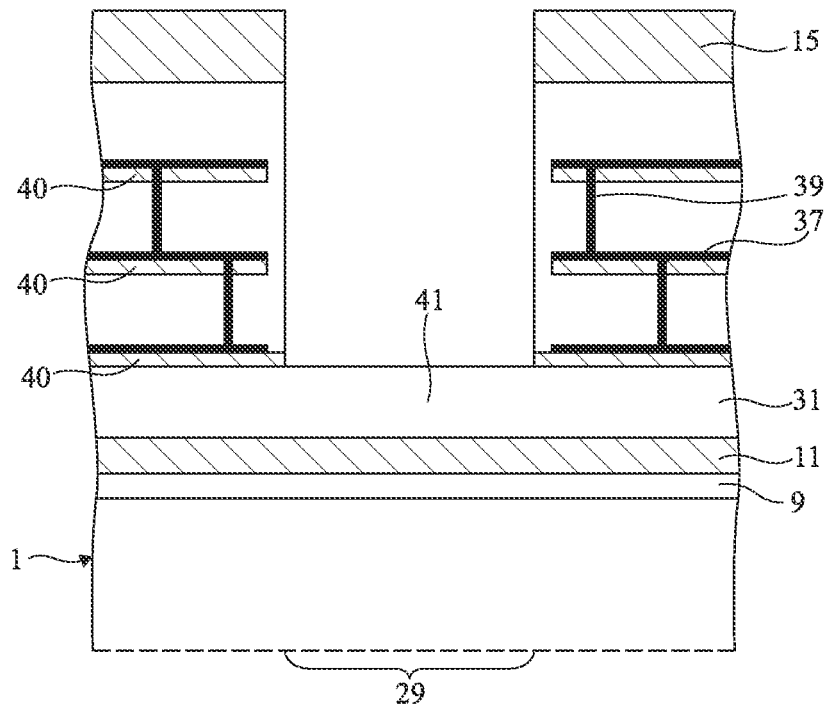

FIGS. 4A and 4B illustrate an example of successive steps of the manufacturing of a photodiode where the absorption is optimized according to the above-described method.

At the step illustrated in FIG. 4A, an active portion 29 of a photodiode, that is, the portion submitted to an illumination, is formed in a silicon semiconductor substrate 1. Active portion 29 of the photodiode is coated with a stack of several insulating layers transparent to the operating wavelength. The shown stack successively comprises, in current embodiments such as illustrated in FIG. 1, a silicon oxide layer 9, an antireflection layer 11, a silicon oxide layer 31, a silicon oxide layer 35, and a thick silicon nitride layer 15.

Metal levels 37 are provided in layer 35, outside of active portion 29. Metal levels 37 may be connected by vias 39. It should be noted that vias (not shown) contact elements formed in silicon substrate 1. The representation of such metal levels and vias is purely symbolical. Under each metal level 37 is formed a layer 40 used as a diffusion barrier, currently made of silicon nitride. Generally, layers 40 are interrupted in front of active portion 29. It is here provided for one of layers 40 to be maintained in place in front of the active portion, which is the lowest layer in the shown example.

FIG. 4B shows a photodiode obtained after removal by etching of the portions of layers 15, 35, and 40 in front of active portion 29 of the photodiode. The portion of layer 40 in front of the active portion is then used as an etch stop layer on etching of silicon oxide layer 35.

According to an embodiment, the thickness of layer 31 under silicon nitride layer 40 temporarily maintained in place has been previously selected to be equal to a desired thickness eox$_D$ corresponding to a maximum absorption, for example, a thickness eox$_D$ equal to eox2. A photodiode having its active portion 29 successively coated with layers 9, 11 and with a portion 41 of silicon oxide layer 31 having its effective thickness eox$_O$ equal, to within manufacturing dispersions, to desired thickness eox$_D$ maximizing the absorption, is then obtained.

Figure 5:
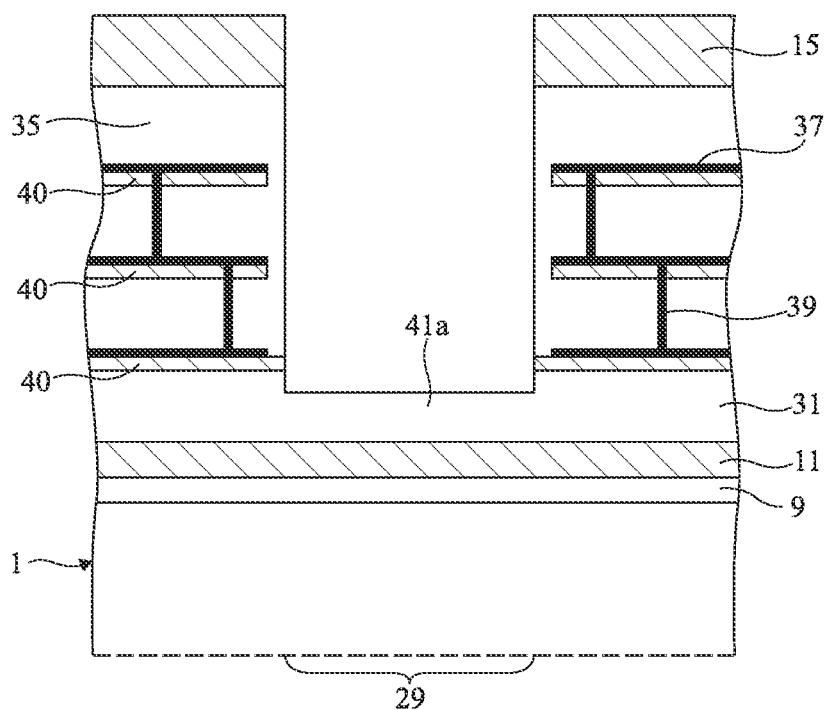
FIG. 5 illustrates a variation of the photodiode of FIG. 4B.

FIG. 5 illustrates a variation of the photodiode of FIG. 4B. After the steps resulting in the structure of FIG. 4B, an additional etch step is performed in the case where the thickness of layer 31 is greater than a desired thickness eox$_D$ maximizing the absorption. This etch step is performed to leave in place, in front of active portion 29, a portion 41a of layer 31 having a desired thickness eox$_D$. A photodiode having its active portion 29 successively coated with layers 9 and 11 and with a portion 41a of silicon oxide layer 31 having its effective obtained thickness eox$_O$ equal, to within manufacturing dispersions, to desired thickness eox$_D$ maximizing the absorption, is then obtained. As a variation, in the case where the thickness of layer 31 is smaller than a desired thickness, additional oxide may be deposited to reach the desired value.

Specific embodiments have been described. Various alterations, modifications, and improvements will occur to those skilled in the art. In particular, one or several filtering layers and a microlens will usually be formed on portion 41 of layer 31.

The manufacturing steps described in relation with FIGS. 4A, 4B, and 5 are likely to have many alterations. For example, at the step illustrated in FIG. 4B, the portion of barrier layer 40 facing the active portion of the photodiode may be left in place, for example, to avoid a possible degradation of the silicon oxide of layer 31 during the etching of this portion of layer 40. In this case, the thickness of layers 31 and 40 is previously selected to correspond to a maximum absorption.

Although a step of manufacturing a photodiode where the lowest layer 40 is maintained in place in front of the active portion has been described, it may be decided to maintain in place another one of layers 40 and to interrupt the lowest layer 40.

Although SPAD-type photodiodes have been more specifically mentioned herein, it should be noted that the described embodiments may be adapted to any sensor comprising front-side illuminated photodiodes.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of making a photodiode, comprising:
   forming an active portion in a silicon substrate;
   covering the active portion with a stack of insulating layers transparent to an infrared wavelength, said stack successively comprising starting from the silicon substrate at least: a first silicon oxide layer having a thickness in the range from 5 to 50 nm, an antireflection layer having its thickness in the range from 10 to 80 nm, and a second silicon oxide layer;
   said photodiode having an optimized quantum efficiency obtained by:
      determining, for said infrared wavelength, a plurality of first thicknesses of silicon oxide corresponding to instances of maximum absorptions of the photodiode, wherein a pseudo-period separates two successive maximum absorption values,
      selecting, from among the first thicknesses, a thickness eoxD so that a maximum manufacturing dispersion D*eoxD is smaller than a half of the pseudo-period, wherein D is a manufacturing dispersion rate, and depositing the second silicon oxide layer having the thickness eoxD within a margin of D*eoxD.

2. The method of claim 1, further comprising coating the second silicon oxide layer with a silicon nitride layer having a thickness smaller than 50 nm.

3. The method of claim 1, wherein the infrared wavelength is in the range from 700 to 1,000 nm.

4. The method of claim 1, wherein the thickness of the substrate is between 1 and 3 µm.

5. The method of claim 1, wherein the antireflection layer is made of silicon nitride.

6. The method of claim 5, wherein the infrared wavelength is equal to 850 nm, the dispersion rate D is equal to 0.1, the thickness of the first silicon oxide layer is 25 nm, the thickness of the antireflection layer is 50 nm, and the thickness eoxD selected for the second silicon oxide layer is selected from the group consisting of 60 nm, 340 nm, and 640 nm.

7. A method of manufacturing a photodiode of optimized quantum efficiency for a desired infrared wavelength, comprising the steps of:
   a) determining a plurality of first thicknesses of silicon oxide corresponding to instances of maximum absorptions of the photodiode at the desired infrared wavelength, wherein a pseudo-period separates two successive maximum absorption values;
   b) selecting, from among the first thicknesses, a thickness eoxD so that a maximum manufacturing dispersion D*eoxD is smaller than a half of the pseudo-period, wherein D is a manufacturing dispersion rate;
   c) providing a photodiode having its active portion formed in a silicon substrate and covered with a stack of insulating layers transparent to said desired infrared wavelength, said stack successively comprising at least: a first silicon oxide layer, an antireflection layer, a second silicon oxide layer having a thickness greater than or equal to said thickness eoxD within a margin of D*eoxD, an etch stop layer, and a third silicon oxide layer; and
   d) etching said stack all the way to the etch stop layer.

8. The method of claim 7, further comprising the step of:
e) etching through the etch stop layer.

9. The method of claim 8, wherein the thickness of the second silicon oxide layer is greater than the desired thickness, eoxD, the method further comprising the step of: f) partially etching the second silicon oxide layer to leave in place a portion of desired thickness eoxD thereof.

10. The method of claim 7, wherein the etch stop layer is made of silicon nitride.

11. A method of manufacturing a photodiode of optimized quantum efficiency, wherein the photodiode has an active portion in a silicon substrate that is covered with a stack of insulating layers transparent to an infrared wavelength, comprising:
   determining, for said infrared wavelength, a plurality of first thicknesses of silicon oxide corresponding to instances of maximum absorptions of the photodiode, wherein a pseudo-period separates two successive maximum absorption values,
   selecting, from among the first thicknesses, a thickness eoxD so that a maximum manufacturing dispersion D*eoxD is smaller than a half of the pseudo-period, wherein D is a manufacturing dispersion rate, and
   forming the stack of insulating layers to include a first silicon oxide layer, an antireflection layer and a second silicon oxide layer, wherein the second silicon oxide layer has the thickness eoxD within a margin of D*eoxD.

12. The method of claim 11, further comprising:
   forming the first silicon oxide layer having a thickness in the range from 5 to 50 nm, and
   forming the antireflection layer having a thickness in the range from 10 to 80 nm.

13. The method of claim 11, further comprising coating the second silicon oxide layer with a silicon nitride layer having a thickness smaller than 50 nm.

14. The method of claim 11, wherein the infrared wavelength is in the range from 700 to 1,000 nm.

15. The method of claim 11, wherein the antireflection layer is made of silicon nitride.

16. The method of claim 5, wherein the infrared wavelength is equal to 850 nm, the dispersion rate D is equal to 0.1, and the thickness eoxD for the second silicon oxide layer is selected from the group consisting of 60 nm, 340 nm, and 640 nm.

17. A method for manufacturing a photodiode having an active portion formed in a silicon substrate and covered with a stack of insulating layers successively including at least one first silicon oxide layer, an antireflection layer, and a second silicon oxide layer, comprising:
   determining, for an infrared wavelength to be received by the photodiode, first thicknesses of the second silicon oxide layer that correspond to maximum absorptions of the photodiode;
   selecting, from among the first thicknesses, a thickness eoxD such that a maximum manufacturing dispersion is smaller than a half of a pseudo-period separating two successive maximum absorption values; and
   forming the second silicon oxide layer on the antireflection layer with said thickness eoxD.

* * * * *